United States Patent
Sim et al.

[19]

[11] Patent Number: 6,097,078

[45] Date of Patent: Aug. 1, 2000

[54] METHOD FOR FORMING TRIPLE WELL IN SEMICONDUCTOR DEVICE

[75] Inventors: Sang-pil Sim, Suwon; Won-saong Lee, Seoul, both of Rep. of Korea

[73] Assignee: Samsung Electronics, Co., Ltd., Suwon, Rep. of Korea

[21] Appl. No.: 09/275,908

[22] Filed: Mar. 24, 1999

[30] Foreign Application Priority Data

Mar. 26, 1998 [KR] Rep. of Korea ............... 98-10583

[51] Int. Cl.[7] .................. H01L 27/02; H01L 21/8238
[52] U.S. Cl. .................. 257/548; 257/297; 257/372; 438/220; 438/525
[58] Field of Search ................... 438/220, 221, 438/223, 224, 225, 226, 227, 228, 525, 527; 257/544, 545, 546, 547, 548, 549, 371, 372

[56] References Cited

U.S. PATENT DOCUMENTS

| | | | |
|---|---|---|---|
| 5,293,060 | 3/1994 | Komori et al. | 257/544 |
| 5,394,007 | 2/1995 | Reuss et al. | 257/544 |
| 5,518,941 | 5/1996 | Lin et al. | 437/43 |
| 5,831,313 | 11/1998 | Han et al. | 257/371 |
| 5,972,745 | 10/1999 | Kalter et al. | 438/220 |

*Primary Examiner*—Donald L. Monin, Jr.
*Attorney, Agent, or Firm*—Marger Johnson & McCollom, P.C.

[57] ABSTRACT

A method is provided for forming a triple well of a semiconductor memory device, where a second well of a second conductive type encloses a second well of a first conductive type. A single mask is used for ion implanting the base of the enclosing well and also the entire enclosed well, which inherently avoids misalignment. Additional doping is provided to the location where the sidewalls of the enclosing well join its base. This is accomplished either by a second, deeper ion implant of the sidewalls, or by ion implanting the base at an angle and rotating it, or both. Alternately, the single mask pattern is processed between the ion implantation steps to alter its width.

22 Claims, 8 Drawing Sheets

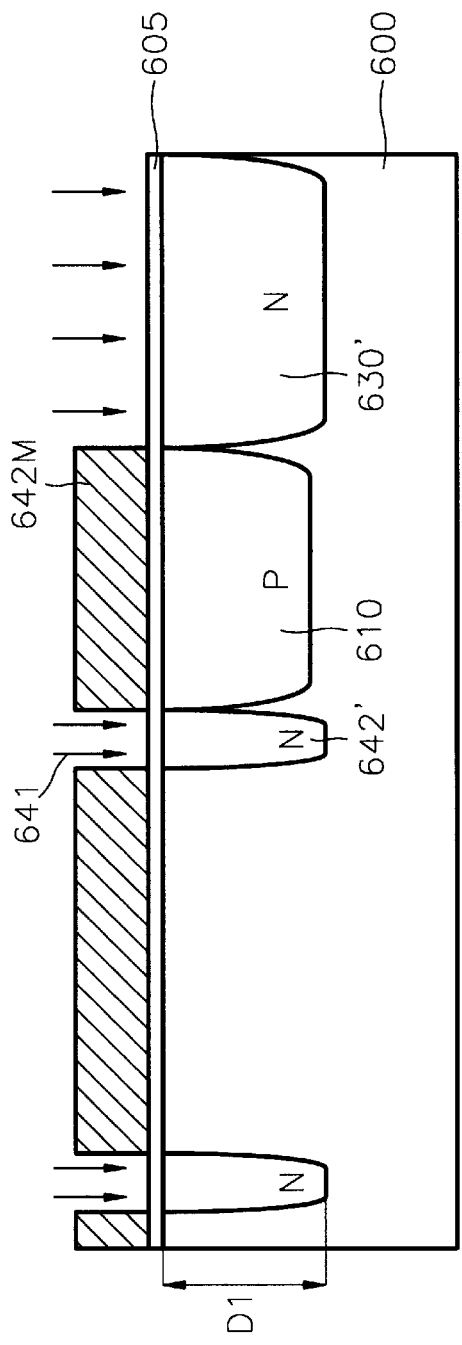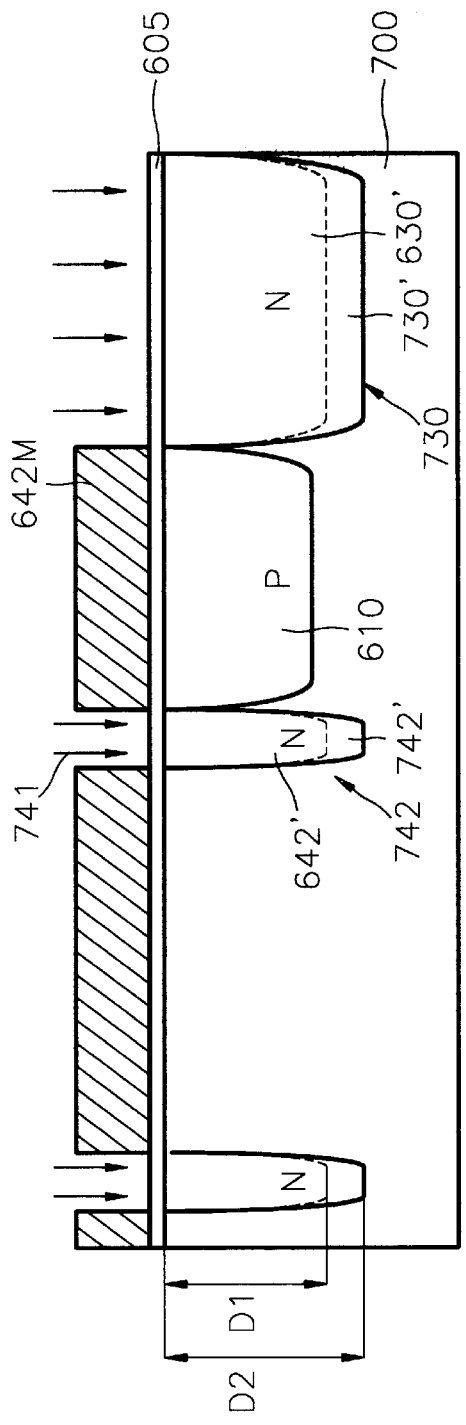
FIG. 6
FIG. 7

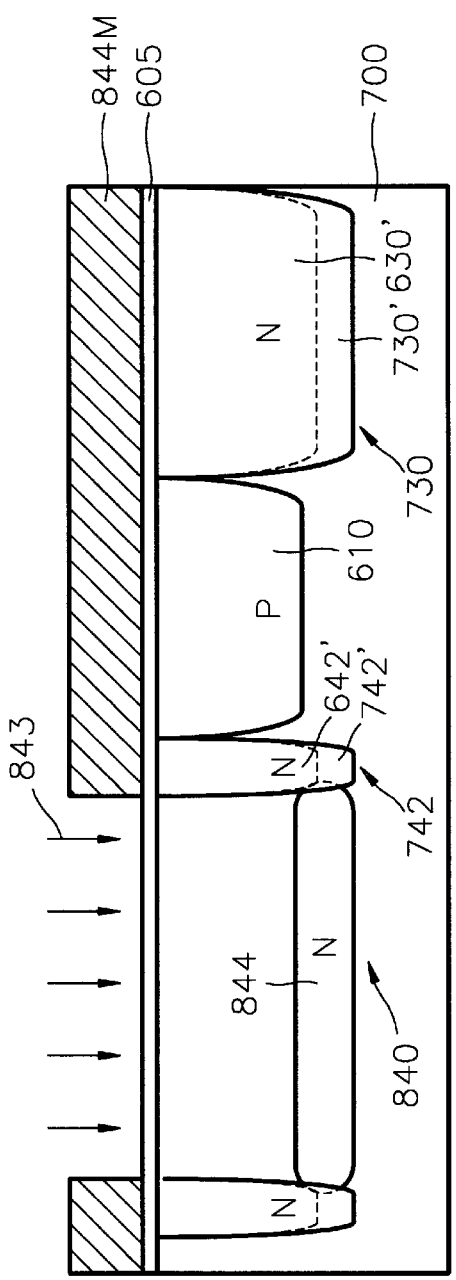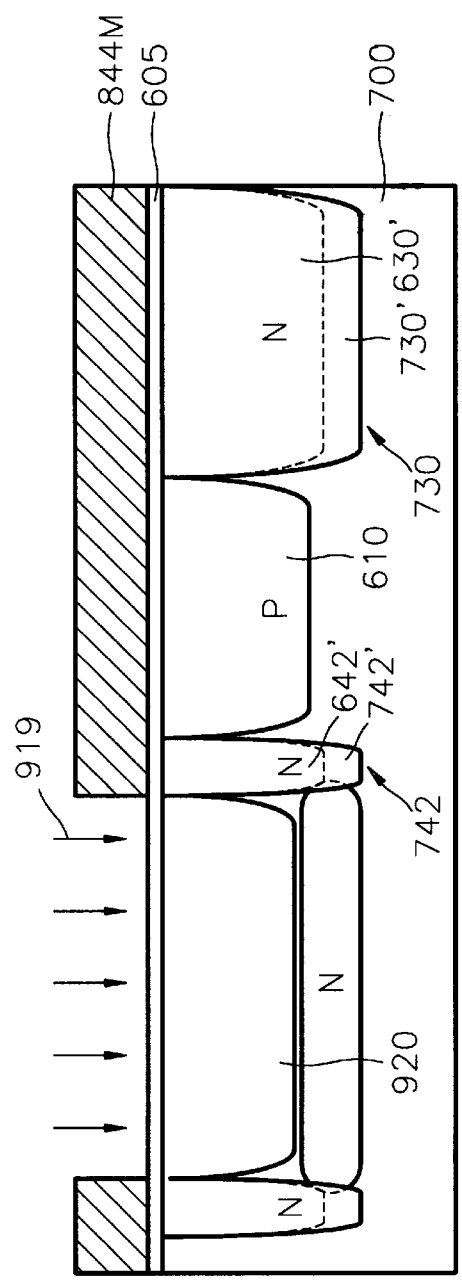

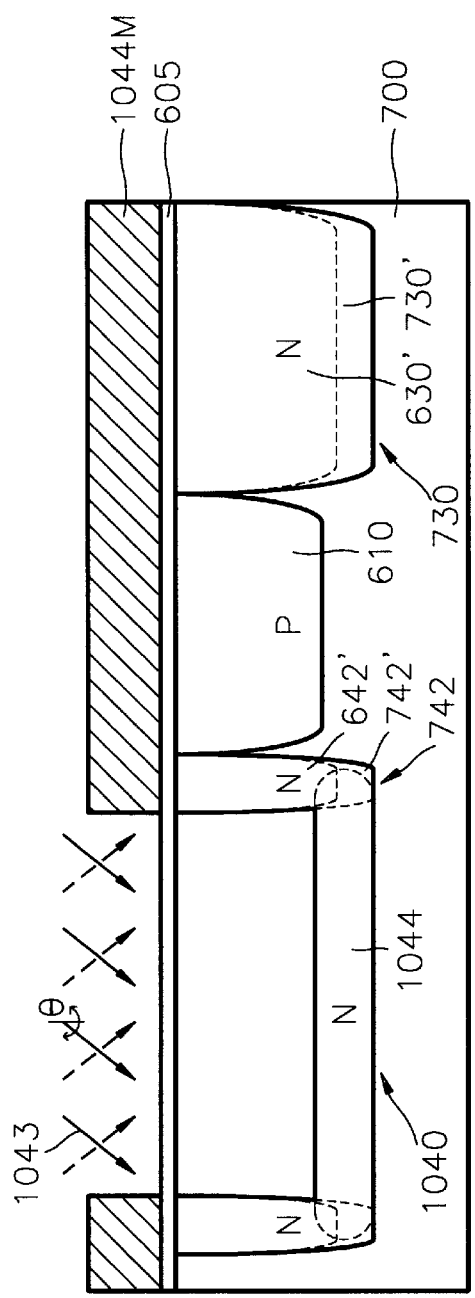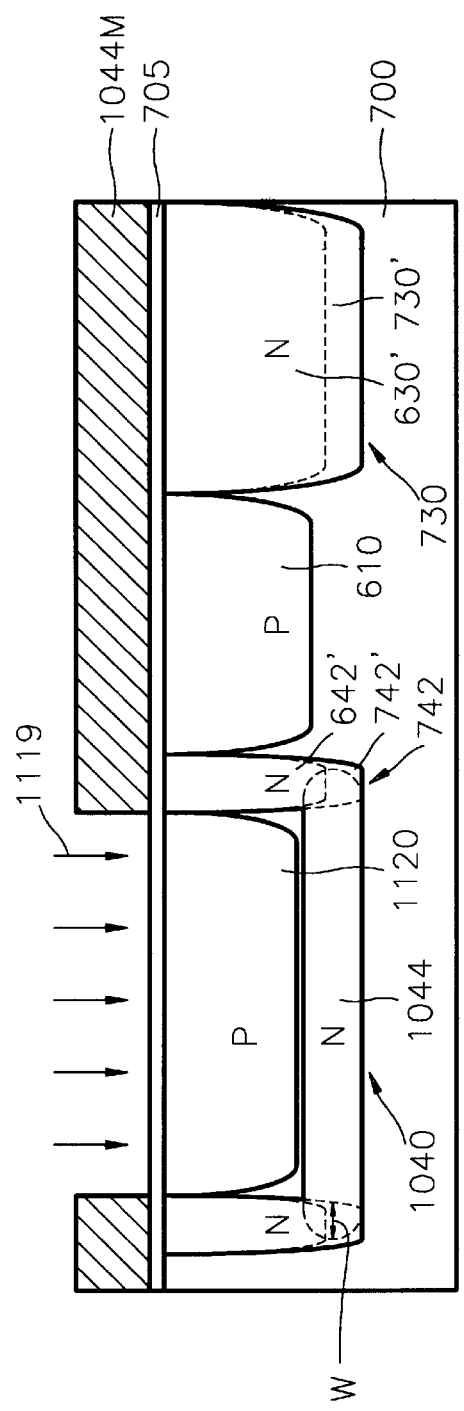

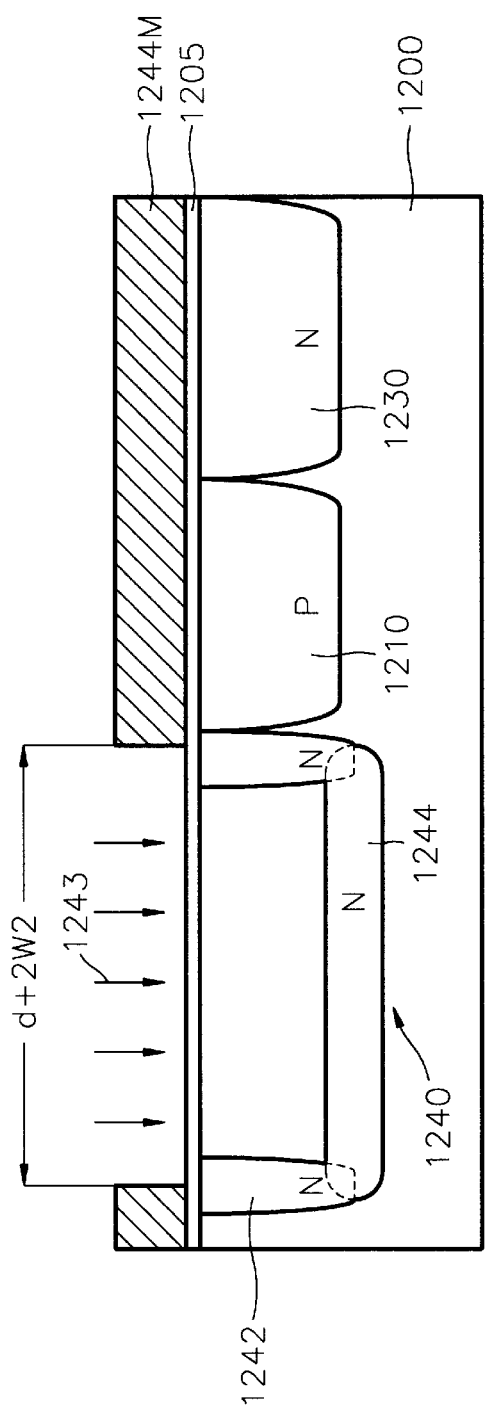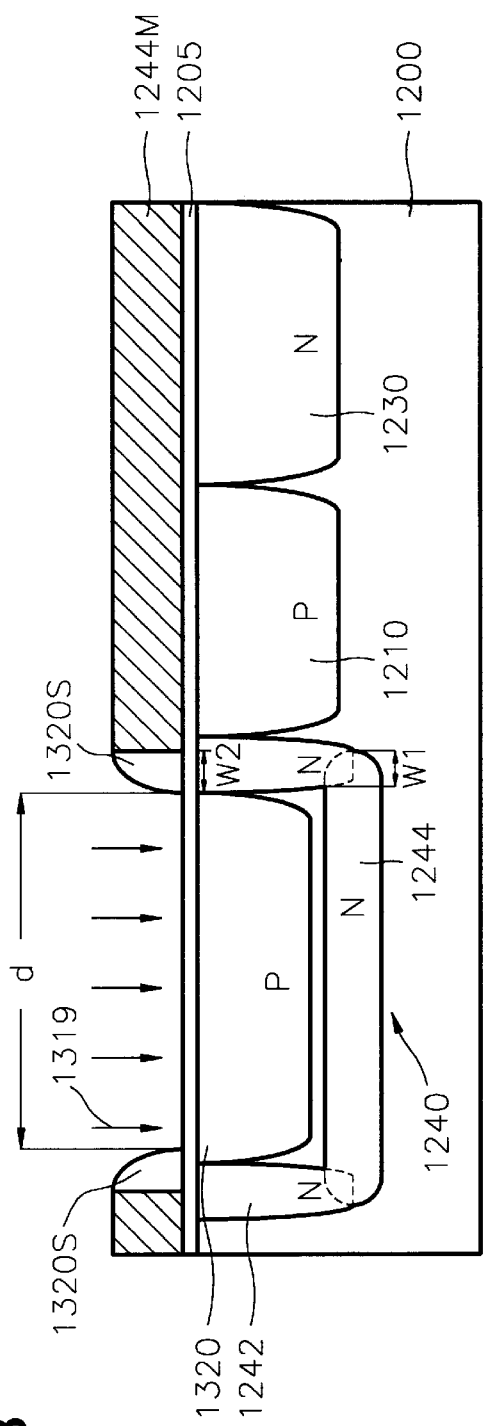

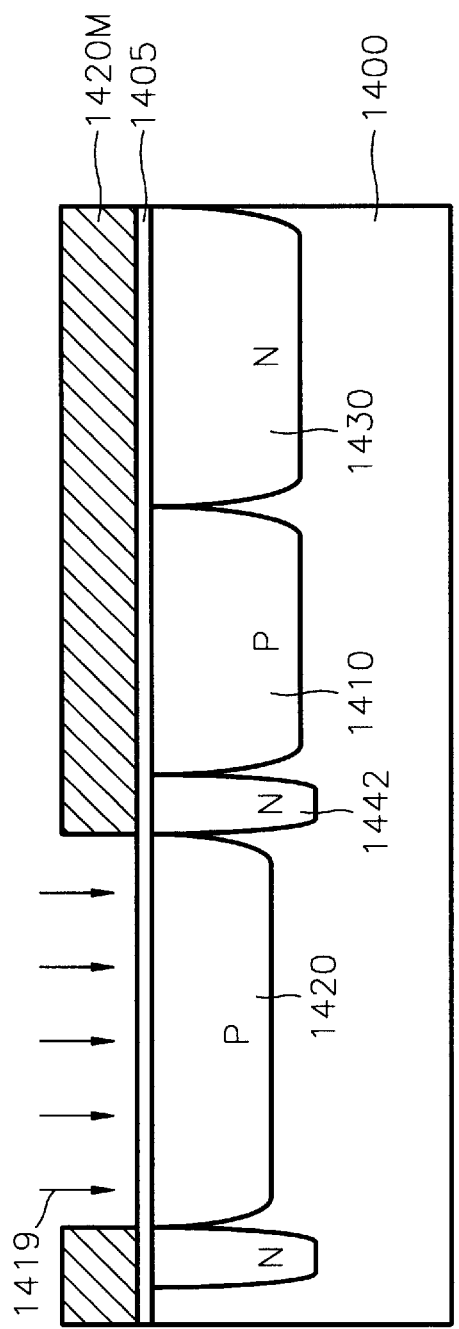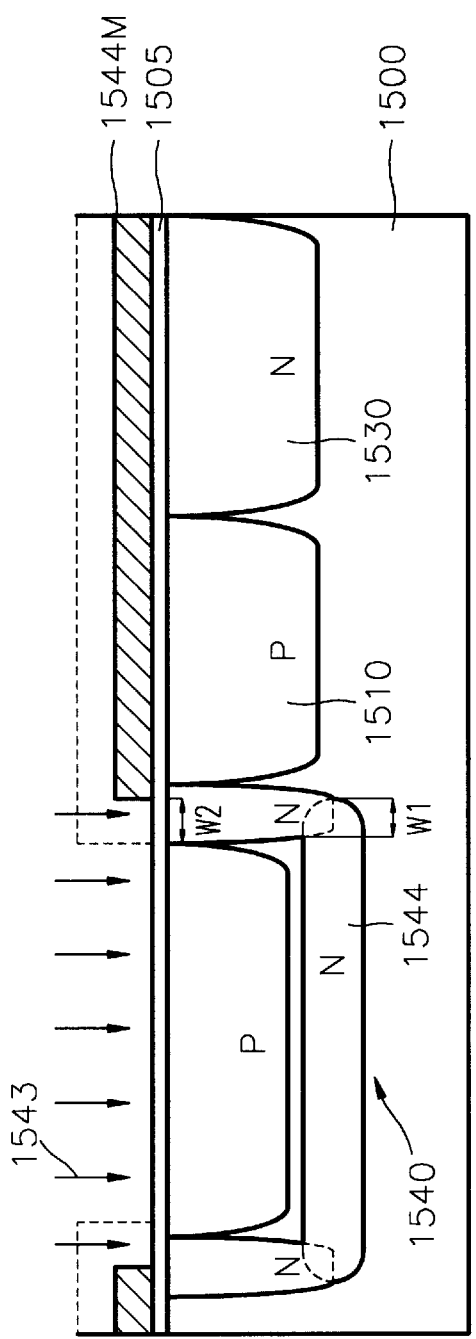

METHOD FOR FORMING TRIPLE WELL IN SEMICONDUCTOR DEVICE

BACKGROUND OF THE INVENTION

1. Field of the Invention

The present invention relates to a method for fabricating a semiconductor memory device, and more particularly to a method for fabricating a triple well of a semiconductor memory device.

2. Description of the Related Art

Complementary metal oxide semiconductor (CMOS) dynamic random access memory (DRAM) devices are driven by a power source voltage $V_{CC}$ and a ground voltage $V_{SS}$. In addition, a back bias voltage $V_{BB}$ is applied to the substrate in order to improve latch up immunity, cell isolation and operation speed. However, in a highly integrated semiconductor memory device such as a submicron device, the back bias voltage increases a short channel effect in N channel transistors. To solve this problem, a triple well structure has been suggested, in which the back bias voltage $V_{BB}$ is applied to a memory cell array region, and the ground voltage $V_{SS}$ is applied in a region of a peripheral circuit region in which N-channel transistors are to be formed, thereby improving the characteristics of the memory device.

A semiconductor memory device adopting such a triple well structure is shown in FIG. 1. Referring to FIG. 1, a first P-type well 110 and a second P-type well 120 in which N channel transistors are to be formed are formed on a P-type substrate. The N-channel transistors include gates 116 and 126, respectively formed on gate oxide films 114 and 124, and beside N-type impurity regions 112 and 122 which become source and drain regions, respectively. Also, a first N-type well 130, having a P-channel transistor, is formed in a peripheral circuit region. Here, the P-channel transistor includes P-type impurity regions 132 to be source and drain regions, a gate oxide film 134 and a gate 136.

The first P-type well 110 and the second P-type well 120 are separated by a second N-type well 140 enclosing the second P-type well 120. The second N-type well 140 has a sidewall region 142 extending vertically below the surface of the substrate 100 to a first depth, and a base region 144 which is formed laterally below the surface of the substrate 100 by a second depth and overlaps with lower portions of the sidewall region 142.

Thus, a back vias voltage $V_{BB}$ is applied to a P-type impurity region 128 formed in the second P-type well 120, and a ground voltage $V_{SS}$ is applied to a P-type impurity region 118 formed in the first P-type well 110. Also, a power source voltage $V_{CC}$ is applied to an N-type impurity region 138 formed in the first N-type well 130.

In the triple well structure, it is important that the base region 144 and the sidewall region 142 of the second N-type well 140 completely enclose the second P-type well 120, to completely electrically isolate the second P-type well 120 from the first P-type well 110. In the fabrication methods of the prior art, a misalignment can occur between photolithographic steps. Such can result instead in forming a base region 144', shown by dashed lines, instead of base region 144. In that case, overlap of the base region 144' and the sidewall region 142 is not complete, which causes an electrical short between the first P-type well 110 and the second P-type well 120.

Another problem in the prior art is that the photolithography process must be performed at least four times, because of the geometry of one well enclosing the other. This renders the overall process complicated and expensive.

SUMMARY OF THE INVENTION

To solve the above problems, it is an objective of the present invention to provide a method for forming a semiconductor device with a triple well having more reliable electrical characteristics. It is an additional object of the invention to provide a method for doing so that is simplified and more cost effective than in the prior art.

The invention provides a method for manufacturing a triple well structure that pays particular attention to the crucial location where the sidewalls overlap with the base of the second well of the second conductive type. The invention teaches methods to supply additional doping in the overlap location while avoiding misalignment, which ensures better electrical insulation.

More particularly, the invention teaches to ion implant the base of the second well of the second conductive type and the entire second well of the first conductive type using a single mask pattern. This inherently provides for better alignment at the overlap location, thereby avoiding the kind of problem described in FIG. 1. In addition, it saves an entire photolithography step. This makes the invention simpler and more economical to practice than the methods of the prior art.

In the first embodiment of the invention, the overlap location is covered by the mask. However, while ion implanting the base, the substrate is also slanted, which supplies additional doping at the overlap location.

In the second embodiment, when the sidewalls are formed, a second ion implantation is performed at a higher energy, which extends the sidewalls downwards. The higher energy is equal to that of the ions for the base, which thus supplies additional doping at the overlap location. The third embodiment is a combination of the first and second embodiments.

The fourth and fifth embodiments also use a single mask pattern (and thus also a single photolithography step) for ion implanting the base of the second well of the second conductive type and the entire second well of the first conductive type. In both, however, the width of the single mask pattern is altered between the ion implantations.

In the fourth embodiment, the base is ion implanted first, along with doping in the overlap location. Then spacers are used to make the mask narrower for ion implanting the second well of the first conductive type.

In the fifth embodiment, the second well of the first conductive type is ion implanted first. Then anisotropic etching is used to make the mask wider for ion implanting the base, along with doping in the overlap location.

BRIEF DESCRIPTION OF THE DRAWINGS

The above objective and advantages of the present invention will become more apparent by describing in detail preferred embodiments thereof with reference to the attached drawings in which:

FIGS. 6 through 9 are successive section views illustrating steps of a method for forming a triple well according to a second embodiment of the present invention;

FIGS. 10 and 11 are successive section views illustrating steps of a method for forming a triple well according to a third embodiment of the present invention;

FIGS. 12 and 13 are successive section views illustrating steps of a method for forming a triple well according to a fourth embodiment of the present invention; and FIGS. 14 and 15 are successive section views illustrating steps of a method for forming a triple well according to a fifth embodiment of the present invention.

DESCRIPTION OF THE PREFERRED EMBODIMENTS

Figure 1:
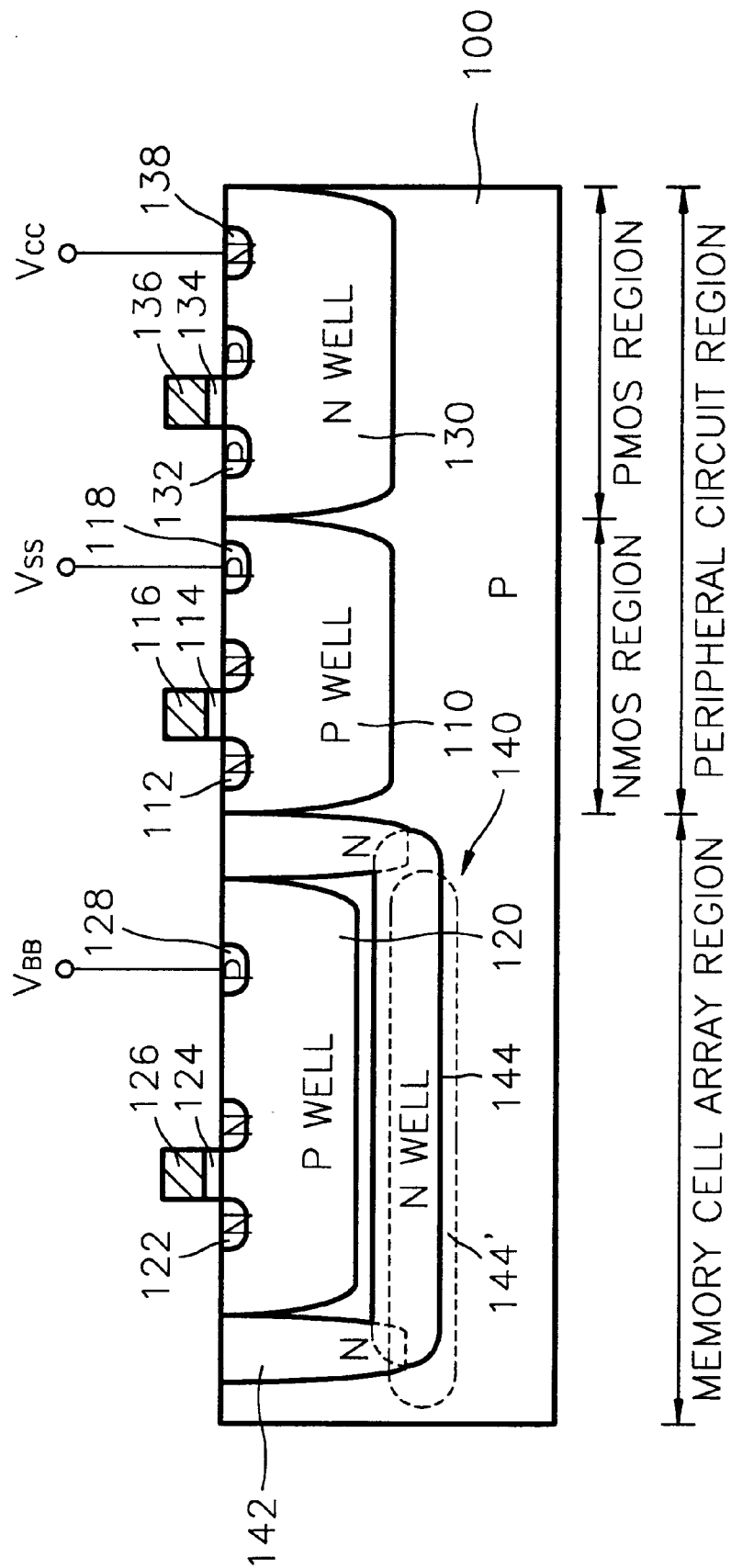
FIG. 1 is a section view of a semiconductor device having a triple well structure formed according to the methods in the prior art.

The present invention now will be described more fully with reference to the accompanying drawings, in which preferred embodiments of the invention are shown. This invention may, however, be embodied in many different forms, and should not be construed as being limited to the embodiments set forth herein; rather, these embodiments are provided so that this disclosure will be thorough and complete, and will fully convey the concepts of the invention to those skilled in the art. In the drawings, the thicknesses of layers and regions may be exaggerated for clarity, and as such are not necessarily to scale.

Figure 2:
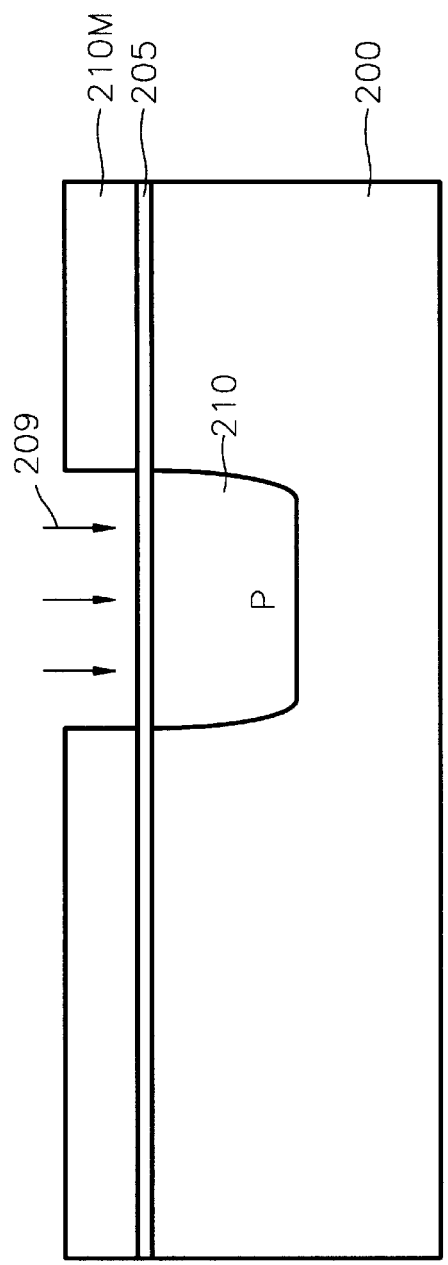
FIGS. 2 through 5 are successive section views illustrating steps of a method for forming a triple well according to a first embodiment of the present invention.

It will also be understood that the conductive type (also known as conductivity type) in the drawings are examples based on a P-type substrate. Thus, the conductive type of the substrate may alternatively be N-type. When an N-type substrate is used, the conductive types of the wells are the opposite of those shown in the drawings. The same reference numerals in different drawings represent the same elements.
Common to all Embodiments Referring to FIG. 2, after forming a pad oxide flim 205 on a first conductive type (e.g., P-type) semiconductor substrate 200 by a general method, a first mask pattern 210M is formed defining a first well 210. Then P-type impurity ions 209 are implanted using the first mask pattern 210M as an ion implantation mask, to form a first P-type well 210. Then the first mask pattern 210M is removed by a general method.

Figure 3:
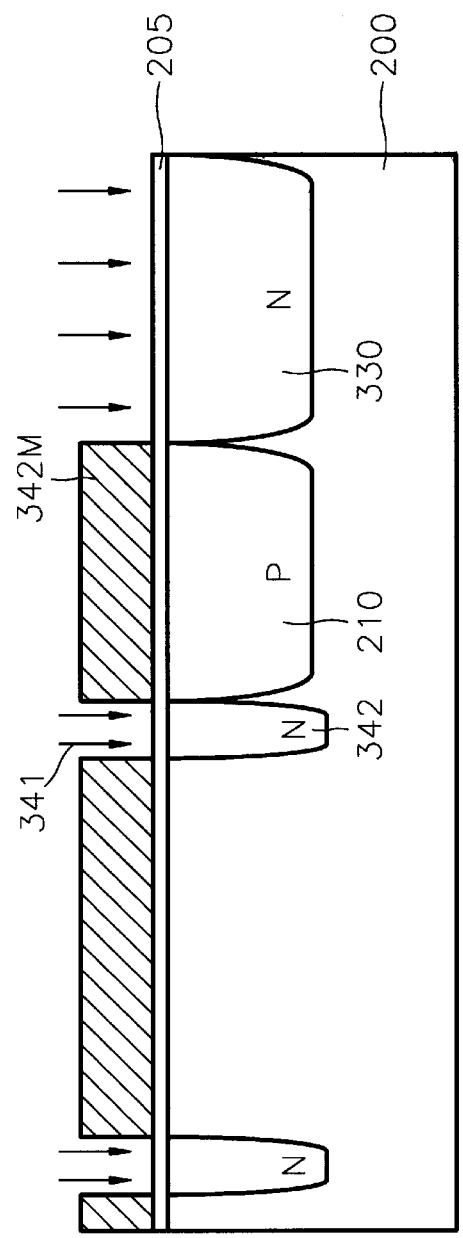

Referring to FIG. 3, a second mask pattern 342M defines a first well 330 (which will be a first well of a second conductive type, e.g., a first N-type well), and sidewalls 342 (which will be sidewalls of a second well of the second conductive type), is formed on the entire surface of the semiconductor substrate. Next an N-type impurity ions 341 are implanted using the second mask pattern 342M as an ion implantation mask, to form a first N-type well 330 in a peripheral circuit region, and N-type sidewall regions 342 in the cell array region. Then the second mask pattern 342M is removed by a general method.
First Embodiment Referring to FIG. 4, a third mask pattern 444M is formed on the entire surface of the substrate 200, exposing the region of the substrate enclosed by the sidewall regions 342. As such, it defines a base region of the second N-type well.

Then N-type impurity ions 443 are implanted slantwise at a nonzero incident angle θ with respect to a line perpendicular to the substrate surface, using the third mask pattern 444M as an ion implantation mask. This forms a base region 444 of the second N-type well 440, thereby completing it. In order to implant the ions 443 slantwise, the substrate 200 is loaded slantwise onto an ion implantation device. It is also rotated around an axis perpendicular to the substrate surface, to distribute the impurities uniformly.

Here, the incident angle θ may range from 5° to 30°. The desired incident angle is determined by the width W1 of an overlapping region between the base region 444 and the sidewall regions 342, and a projected range of the impurity ions, measured as a distance from the surface of the substrate to the region having the maximum impurity concentration. Accordingly, the desired incident angle θ is calculated by the following equation (1).

$$\sin \theta = W1/Rp \quad (1)$$

In the equation (1), θ represents the incident angle, W1 represents the width of an overlapping region between the base region 444 and the sidewall region 342, and Rp represents the projected range of impurity ions.

The optimal Rp of the triple well ranges from 1 to 1.8 μm, and the optimal overlapping width W1 ranges from 0.2 to 0.8 μm. Substituting these in equation (1), the desired incident angle is found to range between 5° and 30°.

As described above, because the N-type impurity ions 443 are implanted slantwise in this embodiment, the base region 444 of the second N-type well may be extended laterally outside the area exposed by the third mask pattern 444M. Thus, the width W1 of the overlapping region between the base region 444 and the sidewall regions 342 of the second N-type well increases, thereby completely electrically isolating the first P-type well 210 from a second P-type well 520 (see FIG. 5) to be formed in a subsequent step. Accordingly, a short between the two wells 210 and 520 is prevented, and different voltages can be applied to the two wells.

Figure 5:
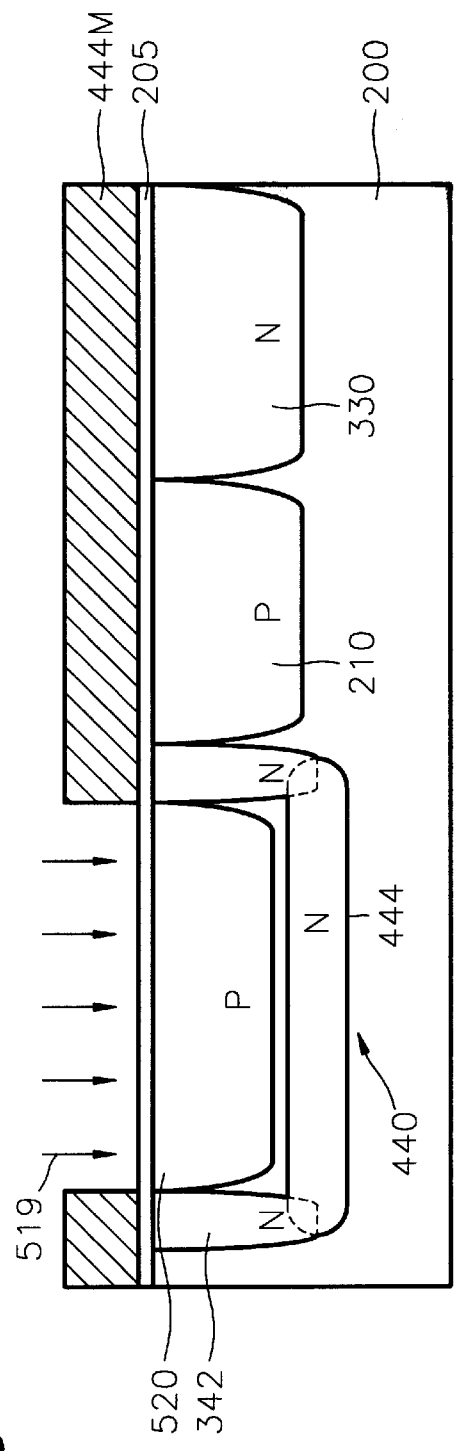

Referring to FIG. 5, P-type impurity ions 519 are implanted by using the third mask pattern as an ion implantation mask, thereby completing a second P-type well 520 enclosed within N-type well 440.

It will be appreciated that the base region 444 of the second N-type well and the second P-type well 520 are formed using one mask pattern 444M. This allows a step of forming a mask pattern, e.g., a photoresist pattern, to be omitted, thereby simplifying the process and lowering manufacturing costs.

It will be obvious that, after forming the first P-type well 210, the first N-type well 330 and the sidewall regions 342 of the second N-type well, the base region 444 of the second N-type well and the second P-type well 520 are formed. However, the order of these steps may be changed. For example, after forming the base region of the second N-type well and the second P-type well 520, the first P-type well 210, the first N-type well 330 and the sidewall regions 342 of the first N-type well may be formed. For another example, the second P-type well 520 may be formed before the base region 444 of the second N-type well is formed. Obviously, the order of the above mentioned steps can be selectively and equivalently applied to the other embodiments that are described hereinafter, if necessary.
Second Embodiment Referring to FIG. 6, a substrate 600 has been prepared (also with a mask pattern 642M) similarly to how substrate 200 of FIG. 3 has been prepared (with a mask pattern 342M). Then N-type impurity ions 641 are implanted at an ion implantation energy ranging from 0.2 to 1.0 MeV, by using the first mask pattern 642M as an ion implantation mask. This forms a first N-type well 630', and sidewall regions 642' of the second N-type well (not yet formed in the embodiment of FIG. 6), each having a depth D1.

Then, as shown in FIG. 7, N-type impurity ions 741 are implanted by again using the first mask pattern 642M as an ion implantation mask. This time the ion implantation energy is increased to the range from 1.0 to 1.8 MeV, to form a first N-type well 730' and sidewall regions 742' of the second N-type well, each having a depth D2. As a result, this completes a first N-type well 730 (that includes well 630' having depth D1 and well 730' having depth D2), and sidewall regions 742 of the second N-type well (that include sidewall regions 642' having depth D1 and sidewall regions 742' having depth D2). Then the first mask pattern 642M is removed by a general method.

Figure 4:
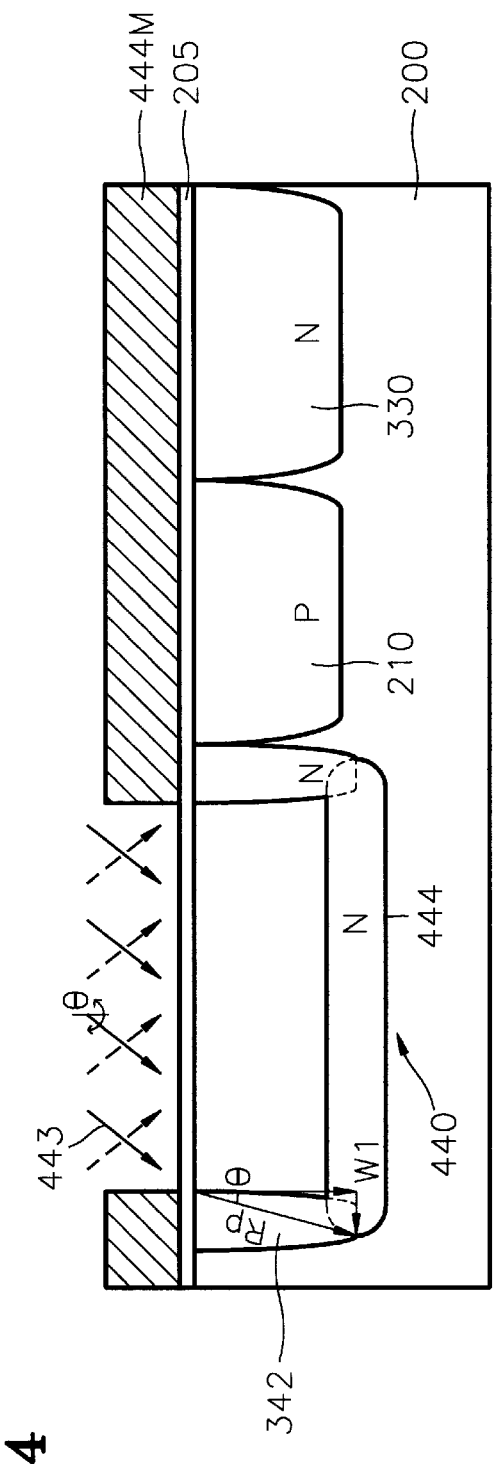

Referring to FIG. 8, a second mask pattern 844M is formed similarly to mask pattern 444M of FIG. 4. Then N-type impurity ions 843 are implanted at an ion implantation energy ranging from 1.0 to 1.8 MeV, using the second mask pattern 844M as an ion implantation mask. This form a base region 844 of the second N-type well. Given the energy range, base region 844 is formed at the same depth range as sidewall regions 742. As such, the sidewall regions 742 overlap sufficiently with the base region 844 in the vertical direction as shown in FIG. 8, thereby completing a second N-type well 840.

Referring to FIG. 9, P-type impurity ions 919 are implanted at an ion implantation energy ranging from 100 to 500 keV, by using again the second mask pattern 844M as an ion implantation mask, to form a second P-type well 920.

In this second embodiment, the sidewall region 742 of the second N-type well is formed by ion implanting two times. In particular, the ion implantation energy for forming the base region 844 and that for forming the sidewall regions 742 to the maximum depth D2 are adjusted to be equal or similar to each other, so that the base region 844 and the sidewall regions 742 overlap sufficiently in the vertical direction, thereby completing the second N-type well 840.

It will be appreciated that the base region 844 and the second P-type well 920 are defined by a single mask pattern 844M, which simplifies the process.

It is possible to perform the ion implantation steps of FIGS. 6 and 7 in a single step. Particularly, it is possible to have the lower portion of sidewall regions 742 and base region 844 overlap sufficiently in the vertical direction, such that well 610 and well 920 are completely isolated from each other. This would be by making sidewall regions 742 extend to the same depth as base region 844, which is accomplished by using an ion implantation energy which is equal or similar to that for forming the base region 844. However, this would have to be at the energy range of 0 to 1.8 MeV. With that wide a range, sidewall regions 742 might not reach the region having depth D2 continuously from the surface of the substrate. Discontinuities would affect the isolation quality. That is why it is preferred that the ion implantation be performed twice, at different ion implantation energies. Also, if required, ion implantation may be performed more than twice.

Third Embodiment

Referring to FIG. 10, a substrate 700 is prepared with a mask pattern 1044M similar to mask pattern 844M of FIG. 8. Then N-type impurity ions 1043 are implanted at an incident angle θ with respect to perpendicular to the substrate 700, using the mask pattern 1044M as an ion implantation mask. As a result, abase region 1044 is formed, which overlaps the sidewall regions 742 laterally as well as vertically, thereby completing a second N-type well 1040.

Referring to FIG. 11, P-type impurity ions 1119 are implanted by again using mask pattern 1044M, thereby forming a second P-type well 1120 in the same way as described for FIG. 9 above. It will be apparent that this third embodiment of the invention is a combination of the first and second embodiments described above. As such, it offers the combined benefits and advantages of both.

Fourth Embodiment

Referring briefly to FIG. 13, a second P-type well 1320 will have a predetermined width d. In addition, the base region 1244 will overlap sidewall regions 1242 by a predetermined width W1 on each side.

Referring now to FIG. 12, a substrate 1200 is prepared similarly to substrate 700 above. Specifically, it has a pad oxide film 1205, a first P-type well 1210, a first N-type well 1230 and sidewall regions 1242 of a second N-type well.

In addition, a mask pattern 1244M, e.g., a photoresist pattern, is formed. The mask pattern defines a base region of a second N-type well 1240. The mask pattern 1244M is formed with a width d+2W2. W2 is determined from the desired W1 in view of the below. As such, the mask pattern expose partially or completely the sidewall regions 1242.

Then, N-type impurity ions 1243 are implanted using the mask pattern 1244M as an ion implantation mask, thereby forming a base region 1244 of the second N-type well. As a result, a second N-type well 1240 including the sidewall regions 1242 and the base region 1244 is completed.

Then, in the case where the mask pattern 1244M is formed of photoresist, a baking step is performed to increase adhesion between the photoresist pattern 1244M and the semiconductor substrate 1200. Preferably, baking of the photoresist pattern 1244M is performed at a temperature ranging from 180 to 230° C., in particular, approximately 200° C. If the baking is performed at a very high temperature, the photoresist pattern 1244M may be deformed.

A dielectric film (not shown) for forming spacers is formed on the entire surface of the semiconductor substrate 1200 having the mask pattern 1244M. Preferably, an oxide film is used as the dielectric film. Also, in the case where the mask pattern 1244M is formed of photoresist, puddling of the photoresist pattern, which is a kind of shrinkage, occurs if the oxide film is formed at a high temperature. Thus, preferably, the oxide film is formed at a low temperature. Preferably, plasma enhanced chemical vapor deposition (PECVD) is used, by which an oxide film can be formed at a low temperature. The deposition temperature is preferably set to a range from 180 to 250° C.

Subsequently, anisotropic etching is performed on the entire surface of the semiconductor substrate having the dielectric film. This forms spacers 1320S having a predetermined width W2 at the sidewalls of the mask pattern 1244M as shown in FIG. 13. The width W2 should be enough to cover the sidewall regions 1242 exposed by the mask pattern 1244M.

Here, the resulting width W2 of the oxide film spacer 1320S depends on the thickness of the mask pattern 1244M and the initial exposure width d+2W2 of the mask pattern 1244M. For example, when the thickness of the mask pattern 1244M is 4,500 A and the exposure width d+2W2 is several hundred μm, the oxide film preferably has a thickness ranging from 1,000 A to 4,000 A. When this oxide film is etched anisotropically, the resulting oxide film spacers 1320S have a width W2 ranging from 1,000 to 4,000 A.

Subsequently, P-type impurity ions 1319 are implanted using the mask pattern 1244M and the spacers 1320S as an ion implantation mask, to form a second P-type well 1320.

Fifth Embodiment

Referring to FIG. 14, a semiconductor substrate 1400 is covered completely by a pad oxide film 1405. It also has a first P-type well 1410, a first N-type well 1430 and sidewall regions 1442 of a second N-type well.

Then a first mask pattern 1420M, is formed, exposing a region in which a second P-type well 1420 is to be formed. The first mask pattern 1420M is formed to completely cover the sidewall regions 1442.

Then, P-type impurity ions 1419 are implanted by using the first mask pattern 1420M as an ion implantation mask. This forms the second P-type well 1420 within the area of the semiconductor substrate 1400 defined by the sidewall regions 1442.

Referring to FIG. 15, after forming the second P-type well 1420, a step of reducing the thickness of the first mask pattern 1420M is performed, which expands the width. If the first mask pattern 1420M is formed of photoresist, anisotropic etching can be performed to reduce the thickness. The anisotropic etching is performed by a general plasma etching method, or using a general descum device.

The original first mask pattern 1420M expressed by dashed lines is reduced to a second mask pattern 1544M indicated by solid lines. The second mask pattern 1544M defines a base region of a second N-type well. The second mask pattern 1544M is formed such that the sidewall regions 1442 of the second N-type well become partially or completely exposed.

In the case where the second mask pattern 1544M is a second photoresist pattern formed by reducing the size of the first mask pattern 1420M (also a photoresist pattern), the processing conditions are adjusted such that the thickness of the resulting second photoresist pattern is to be approximately 2,500 A.

Then, N-type impurity ions 1543 are implanted using the second mask pattern 1544M as an ion implantation mask, to form a base region 1544 of the second N-type well. As shown in FIG. 15, the reduced width W2 of the first mask pattern 1420M determines the width W1 of an overlap region where the base region 1544 of the second N-type well overlaps the sidewall region 1542 of the second N-type well.

That is, in this embodiment, after forming one mask pattern 1420M and then the second P-type well 1420 using the mask pattern 1420M, the side of the second mask pattern 1420M is reduced to form the base region 1544 of the second N-type well wider than the second P-type well. Thus, the second N-type well 1540 is completed by sufficiently overlapping the base region 1544 of the second N-type well with the sidewall region 1542 of the second N-type well.

For all of the above described embodiments, it will be appreciated that a triple well structure can be made with sufficient overlap between the base and the sidewalls of the second N-type well. This effectively prevents a short between the two P-type wells.

In addition, since the base of the second N-type well is ion implanted through the a same mask pattern as the entire second P-well, the overlap is created free from the possibility of misalignment, making for a more reliable process. Further, an entire photolithography step becomes unnecessary, which simplifies the process and renders it more economical.

What is claimed is:

1. A triple well structure of a semiconductor device, in which a semiconductor substrate of a first conductive type has a first well of the first conductive type, a second well of the first conductive type, a first well of a second conductive type, and a second well of the second conductive type enclosing the second well of the first conductive type in order to separate the first well of the first conductive type from the second well of the first conductive type, the second well of the second conductive type having sidewall regions extending below the surface of the substrate to a region having a first depth and a base region overlapping with lower portions of the sidewall regions and formed at a second depth below the surface of the substrate, the device having been formed by a method comprising the steps of:

forming the base region of the second well of the second conductive type and the second well of the first conductive type via ion implantation using the same ion implantation mask pattern.

2. The device of claim 1, further comprising the step of implanting impurities of the second conductive type onto the surface of the semiconductor substrate at a nonzero incident angle θ with respect to a line perpendicular to the semiconductor substrate, using the ion implantation mask pattern, when forming the base region of the second well of the second conductive type, such that the base region of the second well of the second conductive type is formed in a region wider than the region exposed by the mask pattern.

3. The device of claim 2, wherein the incident angle θ ranges from 5° to 30°.

4. The device of claim 1, wherein the sidewall regions have a larger depth than at least the second well of the first conductive type out of the first and second well of the first conductive type.

5. A method for forming a triple well structure of a semiconductor device, in which a semiconductor substrate of a first conductive type has a first well of the first conductive type, a second well of the first conductive type, a first well of a second conductive type and a second well of the second conductive type enclosing the second well of the first conductive type in order to separate the first well of the first conductive type from the second well of the first conductive type, the second conductive type second well having sidewall regions extending below the surface of the substrate to a region having a first depth and a base region overlapping with lower portions of the sidewall regions and formed at a second depth below the surface of the substrate, the method comprising the steps of:

(a) preparing the semiconductor substrate of the first conductive type;

(b) forming a mask pattern defining the base region of the second well of the second conductive type on the semiconductor substrate of the first conductive type;

(c) implanting impurities of the second conductive type onto the surface of the semiconductor substrate at a nonzero incident angle θ with respect to a line perpendicular to the semiconductor substrate, using the mask pattern as an ion implantation mask, such that the base region of the second well of the second conductive type is formed in a region wider than the region exposed by the mask pattern; and (d) implanting impurities of the first conductive type using the mask pattern as an ion implantation mask to form the second well of the first conductive type within the region exposed by the mask pattern.

6. The method of claim 5, wherein the incident angle θ ranges from 5° to 30°.

7. The method of claim 5, wherein the mask pattern defining the base region of the second well of the second conductive type exposes the region of the semiconductor substrate between the inner walls of the sidewall regions of the second well of the second conductive type.

8. A triple well structure of a semiconductor device, in which a semiconductor substrate of a first conductive type has a first well of the first conductive type, a second well of the first conductive type, a first well of a second conductive type and a second well of the second conductive type enclosing the second well of the first conductive type in order to separate the first well of the first conductive type from the second well of the first conductive type, the second well of the second conductive type having sidewall regions extending below the surface of the substrate to a region having a first depth and a base region overlapping with lower portions of the sidewall regions and formed at a second depth below the surface of the substrate, the device having been formed by a method comprising the step of:

forming the sidewall regions and the base region of the second well of the second conductive type using similar ion implantation energies, such that the sidewall regions and the base region overlap each other, wherein the base region of the second well of the second conductive type and the second well of the first conductive type are formed using the same mask pattern as an ion implantation mask.

9. The device of claim 8, wherein the sidewall regions have a larger depth than at least the second well of the first conductive type out of the first and second well of the first conductive type.

10. A method for forming a triple well structure of a semiconductor device, in which a semiconductor substrate of a first conductive type has a first well of the first conductive type, a second well of the first conductive type, a first well of a second conductive type and a second well of the second conductive type enclosing the second well of the first conductive type in order to separate the first well of the first conductive type from the second well of the first conductive type, the second conductive type second well having sidewall regions extending below the surface of the substrate to a region having a first depth and a base region overlapping with lower portions of the sidewall regions and formed at a second depth below the surface of the substrate, the method comprising the steps of:

(a) preparing the semiconductor substrate of the first conductive type;

(b) forming a first mask pattern defining the sidewall regions of the second well of the second conductive type, on the semiconductor substrate of the first conductive type;

(c) implanting impurities of the second conductive type at a first energy using the first mask pattern as an ion implantation mask, to form the sidewall regions extending below the surface of the substrate by the first depth;

(d) removing the first mask pattern;

(e) forming a second mask pattern defining the base region of the second well of the second conductive type, on the semiconductor substrate; and (f) implanting impurities of the second conductive type at a second energy similar to the first energy, using the second mask pattern as an ion implantation mask, to form the base region of the second well of the second conductive type at a second depth similar to the first depth.

11. The method of claim 10, further comprising a step, before the step (d) of removing the first mask pattern, of implanting impurities of the second conductive type at an energy higher than the first energy using the first mask pattern as an ion implantation mask.

12. The method of claim 10, wherein in the step (f) of forming the base region of the second well of the second conductive type, impurities of the second conductive type are implanted into the surface of the semiconductor substrate at a nonzero incident angle θ with respect to a line perpendicular to the semiconductor substrate, using the second mask pattern as an ion implantation mask, such that the base region of the second well of the second conductive type is formed in a region wider than the region exposed by the mask pattern.

13. The method of claim 10, wherein the first mask pattern also defines the first well of the second conductive type, so that the first well of the second conductive type is formed simultaneously with the sidewall regions of the second conductive well in the step (c).

14. The method of claim 10, wherein the sidewall regions are formed having a larger depth than at least the second well of the first conductive type out of the first and second well of the first conductive type.

15. The method of claim 10, further comprising the step of, after step (f), implanting impurities of the first conductive type using the second mask pattern as an ion implantation mask to form the second well of the first conductive type within the region exposed by the second mask pattern.

16. A method for forming a triple well structure of a semiconductor device, in which a semiconductor substrate of a first conductive type has a first well of the first conductive type, a second well of the first conductive type, a first well of the second conductive type and a second well of the second conductive type enclosing the second well of the first conductive type in order to separate the first well of the first conductive type from the second well of the first conductive type, the second well of the second conductive type having sidewall regions extending below the surface of the substrate to a region having a first depth and a base region overlapping with lower portions of the sidewall regions and formed at a second depth below the surface of the substrate, comprising the steps of:

(a) preparing the semiconductor substrate of the first conductive type;

(b) forming a mask pattern defining the base region of the second well of the second conductive type, on the semiconductor substrate of the first conductive type;

(c) implanting impurities of the second conductive type using the mask pattern as an ion implantation mask, to form the base region of the second well of the second conductive type;

(d) forming spacers on sidewalls of the mask pattern; and (e) implanting impurities of the first conductive type using the mask pattern and the spacers as an ion implantation mask, to form the second well of the first conductive type.

17. The method of claim 16, wherein the step (d) of forming the spacers comprises the sub-steps of:

(d1) forming a dielectric film on the entire surface of the semiconductor substrate in which the base region of the second well of the second conductive type has been formed; and (d2) anisotropically etching the dielectric film to form the spacers on the sidewalls of the mask pattern.

18. The method of claim 17, wherein the step (b) of forming the mask pattern comprises the sub-steps of:

(b1) forming a photoresist film on the entire surface of the substrate; and (b2) patterning the photoresist film to form a photoresist pattern defining the base region of the second well of the second conductive type, and wherein the step (d1) is preceded by a step of baking the photoresist pattern, and the step (d1) of forming the dielectric film comprises a step of forming a low-temperature oxide layer.

19. The method of claim 16, wherein the mask pattern exposes at least in part the sidewall regions of the second well of the second conductive type, formed at the sidewalls of the second well of the first conductive type, and wherein the spacers cover the sidewall regions of the second well of the second conductive type exposed by the mask pattern.

20. A method for forming a triple well structure of a semiconductor device, in which a semiconductor substrate of a first conductive type has a first well of the first conductive type, a second well of the first conductive type, a first well of a second conductive type and a second well of the second conductive type enclosing the second well of the first conductive type in order to separate the first well of the first conductive type from the second well of the first conductive type, the second well of the conductive type having sidewall regions extending below the surface of the substrate to a region having a first depth and a base region overlapping with lower portions of the sidewall regions and formed at a second depth below the surface of the substrate, comprising the steps of:

(a) preparing the semiconductor substrate of the first conductive type;

(b) forming a first mask pattern defining the second well of the first conductive type, on the semiconductor substrate of the first conductive type;

(c) implanting impurities of the first conductive type using the first mask pattern as an ion implantation mask, to form the second well of the first conductive type;

(d) reducing the size of the first mask pattern to form a second mask pattern exposing a region wider than the region exposed by the first mask pattern; and (e) implanting impurities of the second conductive type using the second mask pattern as an ion implantation mask to form the base region of the second well of the second conductive type beneath the second well of the first conductive type, having a greater width than the second well of the first conductive type.

21. The method of claim 20, wherein the step (b) of forming the first mask pattern comprises the sub-steps of:

(b1) forming a photoresist film on the entire surface of the semiconductor substrate; and (b2) patterning the photoresist film to form a first photoresist pattern exposing a region where the second well of the first conductive type is to be formed, and wherein the step (d) of forming the second mask pattern comprises a step of forming a second photoresist pattern exposing a region wider than the region exposed by the first photoresist pattern by anisotropically etching the first photoresist pattern.

22. The method of claim 20, wherein the second mask pattern is formed to expose at least in part the sidewall regions of the second well of the second conductive type, formed at the sidewalls of the second well of the first conductive type.

* * * * *